US009798333B2

(12) United States Patent
DeCarr et al.

(10) Patent No.: US 9,798,333 B2
(45) Date of Patent: Oct. 24, 2017

(54) PROGRAMMABLE TEMPERATURE CONTROLLER FOR HAZARDOUS LOCATION ENCLOSURES

(71) Applicants: Graig E. DeCarr, Cicero, NY (US); Samuel T. Barbuto, Liverpool, NY (US); Joseph Michael Manahan, Manlius, NY (US)

(72) Inventors: Graig E. DeCarr, Cicero, NY (US); Samuel T. Barbuto, Liverpool, NY (US); Joseph Michael Manahan, Manlius, NY (US)

(73) Assignee: Cooper Technologies Company, Houston, TX (US)

(*) Notice: Subject to any disclaimer, the term of this patent is extended or adjusted under 35 U.S.C. 154(b) by 1189 days.

(21) Appl. No.: 13/842,019

(22) Filed: Mar. 15, 2013

(65) Prior Publication Data

US 2014/0054025 A1 Feb. 27, 2014

Related U.S. Application Data

(60) Provisional application No. 61/692,870, filed on Aug. 24, 2012.

(51) Int. Cl.
 *G05D 23/00* (2006.01)
 *G05D 23/19* (2006.01)
 *H05K 7/20* (2006.01)

(52) U.S. Cl.
 CPC ............ *G05D 23/00* (2013.01); *G05D 23/19* (2013.01); *G05D 23/1917* (2013.01); *H05K 7/20945* (2013.01)

(58) Field of Classification Search
 CPC .... G05D 23/00; G05D 23/19; G05D 23/1917; H05K 7/20945
 (Continued)

(56) References Cited

U.S. PATENT DOCUMENTS 2,801,768 A   8/1957  Immel
2,917,384 A  12/1959  Grandey
(Continued)

FOREIGN PATENT DOCUMENTS

CN        1756012     4/2006
CN      201207137     3/2009
(Continued)

OTHER PUBLICATIONS

Machine translation of CN1756012A, via Lexisnexis Total Patent, 5 pages.
(Continued)

*Primary Examiner* — Travis Ruby
(74) *Attorney, Agent, or Firm* — King & Spalding LLP (57) ABSTRACT

An enclosure system that can include a hazardous location enclosure having at least one wall forming a cavity. The enclosure system can also include a temperature-sensitive component positioned within the cavity. The enclosure system can further include a measuring device configured to measure a temperature within the cavity of the hazardous location enclosure. The enclosure system can also include a climate control device configured to change the temperature within the cavity. The enclosure system can further include a controller operatively coupled to the climate control device and the measuring device, where the controller controls the climate control device to change the temperature within the cavity of the hazardous location enclosure.

18 Claims, 6 Drawing Sheets

(58) Field of Classification Search
USPC .............................. 165/287, 244, 247
See application file for complete search history.

(56) References Cited

U.S. PATENT DOCUMENTS

| | | | |
|---|---|---|---|
| 4,158,875 | A | 6/1979 | Tajima et al. |
| 4,328,901 | A | 5/1982 | Gunderman et al. |
| 5,395,042 | A | 3/1995 | Riley et al. |
| 5,696,500 | A | 12/1997 | Diem |
| 5,765,636 | A * | 6/1998 | Meyer .................. F24F 11/0001 165/244 |
| 5,914,858 | A | 6/1999 | McKeen et al. |
| 6,294,721 | B1 | 9/2001 | Oravetz et al. |
| 6,392,322 | B1 | 5/2002 | Mares et al. |
| 6,525,936 | B2 | 2/2003 | Beitelmal et al. |
| 6,533,031 | B1 | 3/2003 | Garcia et al. |
| 6,574,105 | B2 | 6/2003 | Nakano et al. |
| 6,657,863 | B2 | 12/2003 | Lee et al. |
| 6,900,565 | B2 | 5/2005 | Preston |
| 6,953,491 | B2 | 10/2005 | Goyetche |
| 7,016,193 | B1 | 3/2006 | Jacques et al. |
| 7,310,228 | B2 | 12/2007 | Chen |
| 7,505,269 | B1 | 3/2009 | Cosley et al. |
| 7,611,402 | B2 | 11/2009 | McClellan et al. |
| 7,752,858 | B2 | 7/2010 | Johnson et al. |
| 2005/0029881 | A1* | 2/2005 | Preston .................. H02K 11/33 310/88 |
| 2006/0202045 | A1 | 9/2006 | Liu |
| 2007/0095554 | A1 | 5/2007 | Noda |
| 2007/0231677 | A1 | 10/2007 | Stocchiero |
| 2007/0285889 | A1 | 12/2007 | Watson et al. |
| 2008/0060371 | A1 | 3/2008 | Jude |
| 2008/0137296 | A1 | 6/2008 | DuQuette et al. |
| 2008/0256693 | A1 | 10/2008 | Mickleson et al. |
| 2009/0097202 | A1 | 4/2009 | Gipson |
| 2009/0253360 | A1 | 10/2009 | Tafoya |
| 2010/0284150 | A1 | 11/2010 | Manahan et al. |
| 2010/0288467 | A1 | 11/2010 | Manahan et al. |
| 2011/0120067 | A1 | 5/2011 | Kim |
| 2011/0141684 | A1 | 6/2011 | Klarer |

FOREIGN PATENT DOCUMENTS

| | | |
|---|---|---|
| CN | 201708457 | 1/2011 |
| CN | 102222861 | 10/2011 |
| CN | 202339514 | 7/2012 |
| EP | 1729202 | 12/2006 |
| JP | 2006243635 | 9/2006 |
| RU | 32301 | 9/2003 |
| RU | 89200 | 11/2009 |
| RU | 110518 | 11/2011 |
| RU | 111901 | 12/2011 |
| WO | 2004038173 | 5/2007 |

OTHER PUBLICATIONS

Machine translation of CN202339514U, via Lexisnexis Total Patent, 5 pages.

The State Intellectual Property Office of China, Office Action issued in Chinese Patent Application No. 201380055889.7, issued Mar. 28, 2016, 12 pages.

Translation of Office Action issued in Chinese Patent Application No. 2013800558897, issued Mar. 28, 2016, 18 pages.

English Machine Translation of EP1729202.

Crouse-Hinds by Eaton, Article 500-516 of the National Electrical Code with Product Recommendations for Use in Hazardous (Classified) Areas, Eaton's Crouse-Hinds 2014 Code Digest, Jan. 2014, pp. 1-128, Eaton Corporation, Cleveland, Ohio.

Nema, Nema Enclosure Types, Nov. 2005, 9 pages, National Electrical Manufacturers Association.

Chinese Office Action issued in Chinese Patent Application No. 2013800558897, issued Sep. 18, 2016, with translation of Office Action, 30 pages.

Machine Translation of CN201207137 via European Patent Office, 7 pages.

Machine Translation of CN102222861 via European Patent Office, 6 pages.

Machine Translation of CN201708457 via European Patent Office, 6 pages.

* cited by examiner

PROGRAMMABLE TEMPERATURE CONTROLLER FOR HAZARDOUS LOCATION ENCLOSURES

CROSS-REFERENCE TO RELATED APPLICATIONS

This application claims priority under 35 U.S.C. §119 to U.S. Provisional Patent Application Ser. No. 61/692,870, titled "Programmable Temperature Controller for Hazardous Location Enclosure" and filed on Aug. 24, 2012, the entire contents of which are hereby incorporated herein by reference.

The present application is also related to U.S. patent application Ser. No. 13/331,331 filed on Dec. 20, 2011, and entitled "Controlling Airflow Within an Explosion-Proof Enclosure" in the names of Joseph Michael Manahan and Graig E. DeCarr, the entire contents of which are hereby incorporated herein by reference.

TECHNICAL FIELD

The present disclosure relates generally to controlling temperature within a hazardous location enclosure, and more particularly to systems, methods, and devices for controlling heating and cooling devices to control temperature within an explosion-proof enclosure, including heat-producing equipment, heat-sensitive equipment, and cold-sensitive equipment.

BACKGROUND

Hazardous location housings (e.g., explosion-proof receptacle housings) and enclosure systems are used in many different industrial applications. Such hazardous location housing and enclosure systems may be used, for example, in military applications, onboard ships, assembly plants, power plants, oil refineries, petrochemical plants, and other harsh environments. At times, the equipment located inside such hazardous location housing and enclosure systems are used to control motors and other industrial equipment.

Traditional motor starters and related equipment fail to provide adequate torque control and result in excessive wear on the motor and associated equipment. Instead, variable frequency drives (VFDs) are often used in place of traditional motor starters. However, VFDs tend to generate heat and are subject to failure when exposed to excessively high temperatures caused by the heat loss. In addition, VFDs and other equipment inside such an enclosure can fail or operate at a reduced performance level at severely cold temperatures. A common practice to reduce heat-related and cold-related problems is to remove the VFD to a remote location so that an explosion-proof receptacle housing and enclosure system is not required, allowing proper cooling of the VFD during operation. However, installation costs may increase and operational problems may result from increased line losses from the added distance that signals between the VFD and the related equipment must travel.

SUMMARY

In general, in one aspect, the disclosure relates to an enclosure system. The enclosure system can include a hazardous location enclosure having at least one wall forming a cavity. The enclosure system can also include a temperature-sensitive component positioned within the cavity. The enclosure system can further include a measuring device configured to measure a temperature within the cavity of the hazardous location enclosure. The enclosure system can also include a climate control device configured to change the temperature within the cavity. The enclosure system can further include a controller operatively coupled to the climate control device and the measuring device, where the controller controls the climate control device to change the temperature within the cavity of the hazardous location enclosure.

In another aspect, the disclosure can generally relate to a method for controlling temperature within a hazardous location enclosure. The method can include receiving a first input signal generated by a measuring device, where the first input signal corresponds to a first temperature within the interior of the hazardous location enclosure. The method can also include determining, based on the first input signal and using a hardware processor, that the first temperature is outside an operating range of temperatures. The method can further include sending, based on determining that the first temperature is outside the operating range of temperatures, a first operating signal to a climate control device within the hazardous location enclosure. The first operating signal can operate the climate control device to change the first temperature.

In yet another aspect, the disclosure can generally relate to a controller. The controller can include memory that stores software instructions for operating at least one climate control device disposed in a hazardous location enclosure. The controller can also include a storage repository that stores temperature threshold values, operating data for the at least one temperature control device, and operating parameters. The controller can further include a hardware processor communicably coupled to the memory and the storage repository, where the memory executes, based on the temperature threshold values, the software instructions.

These and other aspects, objects, features, and embodiments will be apparent from the following description and the appended claims.

BRIEF DESCRIPTION OF THE DRAWINGS

The drawings illustrate only example embodiments of controlling temperature within a hazardous location enclosure and are therefore not to be considered limiting of its scope, as the disclosure may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION

Example embodiments of controlling temperature within a hazardous location enclosure will now be described in detail with reference to the accompanying figures. Like elements in the various figures are denoted by like reference numerals for consistency.

In the following detailed description of example embodiments of controlling temperature within a hazardous location enclosure, numerous specific details are set forth in order to provide a more thorough understanding of controlling temperature within a hazardous location enclosure. However, it will be apparent to one of ordinary skill in the art mat controlling temperature within a hazardous location enclosure may be practiced without these specific details. In other instances, well-known features have not been described in detail to avoid unnecessarily complicating the description. Further, certain descriptions (e.g., top, bottom, side, end, interior, inside) are merely intended to help clarify aspects of controlling temperature within a hazardous location enclosure and are not meant to limit embodiments of controlling temperature within a hazardous location enclosure.

In general, example embodiments of controlling temperature within a hazardous location enclosure provide systems, methods, and devices for using a heater and/or an air moving device to regulate temperature within a hazardous location enclosure to heat cold-sensitive components and/or to cool heat-sensitive components within the enclosure. Specifically, certain example embodiments of controlling temperature within a hazardous location enclosure provide for using a controller to operate an air moving device and/or a heater to regulate temperature within the enclosure. As used herein, the terms "device" and "component" can be used interchangeably.

Example embodiments described herein are directed to hazardous location enclosures. As defined herein, a hazardous location is any location where the enclosure can be exposed to extreme conditions. Extreme conditions can include, but are not limited to, high temperatures, low temperatures, temperature fluctuations, corrosion, humidity, chemicals, vibrations, and dust. The example enclosures discussed herein can be one or more of a number of different types of enclosures, including but not limited to explosion-proof enclosures, junction boxes, control panels, lighting panels, motor control centers, switchgear cabinets, relay cabinets, and/or any other type of enclosure that can be used in conjunction with example embodiments of controlling temperature within the enclosure.

A user may be any person that interacts with the hazardous location enclosure or equipment controlled by one or more components of the hazardous location enclosure. Specifically, a user may program, operate, and/or interface with one or more components (e.g., a controller) associated with controlling temperature within a hazardous location enclosure. Examples of a user may include, but are not limited to, an engineer, an electrician, an instrumentation and controls technician, a mechanic, an operator, a consultant, a contractor, and a manufacturer's representative.

In one or more example embodiments, the temperature-sensitive components inside the hazardous location enclosure are any components that experience reduced performance and/or failure when exposed to high and/or low temperatures during operation. A component may include, but is not limited to, one or more of a device (e.g., VFD, sensor, control panel, circuit board, relay), a terminal, cable, wiring, a switch, a handle, an indicating light, a duct, and conduit.

In some cases, a temperature-sensitive component such as a VFD generates heat when operating, where the heat radiates into the interior of the hazardous location enclosure to raise the temperature inside the hazardous location enclosure. In addition, or in the alternative, other components not sensitive to temperatures generate heat within the hazardous location enclosure to raise the temperature inside the hazardous location enclosure. In some cases, external factors (e.g., sub-zero temperatures outside the hazardous location enclosure) can affect the temperature inside the hazardous location enclosure.

In one or more example embodiments, the hazardous location enclosure is an explosion-proof enclosure (also known as a flame-proof enclosure). An explosion-proof enclosure is an enclosure that is configured to contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, a hazardous location enclosure is subject to meeting certain standards and/or requirements. For example, the NEMA sets standards with which an enclosure must comply in order to qualify as an explosion-proof enclosure. Specifically, NEMA Type 7, Type 8, Type 9, and Type 10 enclosures set standards with which an explosion-proof enclosure within a hazardous location must comply. For example, a NEMA Type 7 standard applies to enclosures constructed for indoor use in certain hazardous locations. Hazardous locations may be defined by one or more of a number of authorities, including but not limited to the National Electric Code (e.g., Class 1, Division I) and Underwriters' Laboratories, Inc. (UL) (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Figure 1:
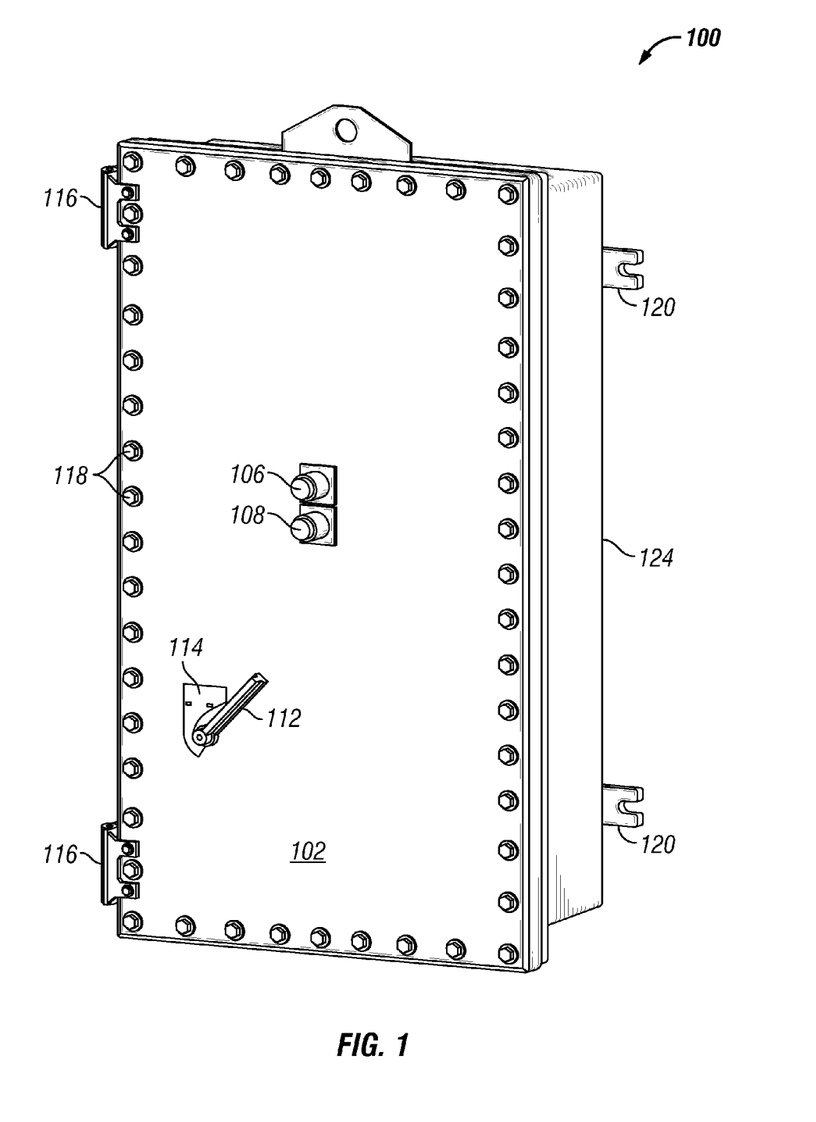
FIGS. 1 and 2 show hazardous location enclosures in which one or more example embodiments of controlling airflow may be implemented.
Figure 2:
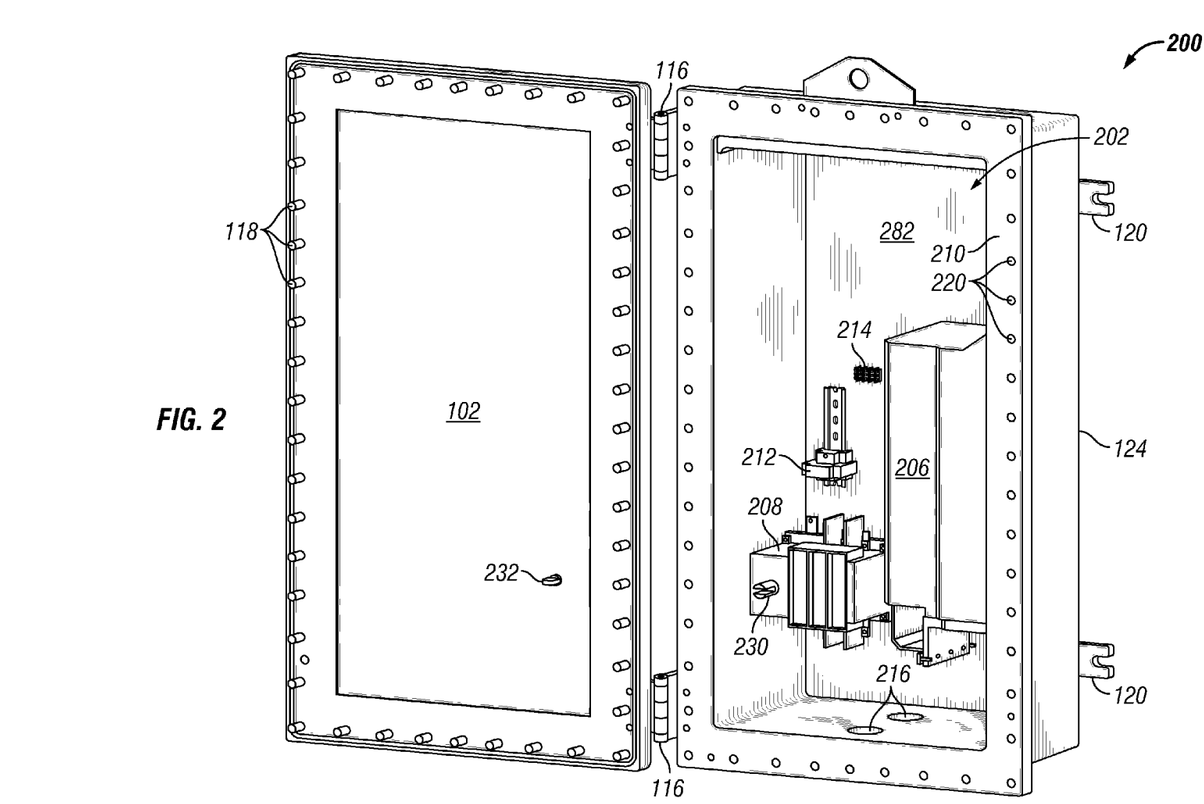

FIGS. 1 and 2 depict an explosion-proof enclosure 100, a type of hazardous location enclosure, in which one or more example embodiments of controlling temperature within a hazardous location enclosure may be implemented. In one or more example embodiments, one or more of the components shown in FIGS. 1 and 2 may be omitted, repeated, and/or substituted. Accordingly, example embodiments of a hazardous location enclosure should not be considered limited to the specific arrangements of components shown in FIGS. 1 and 2.

Referring now to FIG. 1, an example of a hazardous location enclosure 100 in a closed position is shown. The enclosure cover 102 is secured to the enclosure body 124 by a number of fastening devices 118 located at a number of points around the perimeter of the enclosure cover 102. In one or more example embodiments, a fastening device 118 may be one or more of a number of fastening devices, including but not limited to a bolt (which may be coupled with a nut), a screw (which may be coupled with a nut), and a clamp. In addition, one or more hinges 116 are secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 116. In one or more example embodiments, there are no hinges, and the enclosure cover 102 is separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials.

In one or more example embodiments, on the end of the enclosure body 124 opposite the enclosure cover 102, one or more mounting brackets 120 are affixed to the exterior of the enclosure body 124 to facilitate mounting the enclosure 100. Using the mounting brackets 120, the enclosure 100 may be mounted to one or more of a number of surfaces and/or elements, including but hot limited to a wall, a control cabinet, a cement block, an I-beam, and a U-bracket.

The enclosure cover 102 may include one or more features that allow for user interaction while the enclosure 100 is sealed in the closed position. As shown in FIG. 1, one or more indicating lights (e.g., indicating light 1 106, indicting light 2 108) may be located on the enclosure cover 102. Each indicating light may be used to indicate a status of a feature or process associated with equipment inside the enclosure 100. For example, an indicating light may show a constant green light if a motor controlled by a VFD inside the enclosure 100 is operating. As another example, an indicating light may flash red when a motor controlled by a VFD inside the enclosure 100 has a problem (e.g., tripped circuit, VFD overheats, overcurrent situation). As another example, an indicating light may show a constant red light when a controller (described below with respect to FIG. 3) that controls the temperature inside (within the cavity of) the enclosure 100 detects a temperature outside an operating range of temperatures. An indicating light may be made of one or more materials (e.g., glass, plastic) using one or more different lighting sources (e.g., light-emitting diode (LED), incandescent bulb).

In one or more example embodiments, the enclosure cover 102 may also include a switch handle 112 that allows a user to operate a switch (not shown) located inside the hazardous location enclosure 100 while the hazardous location enclosure 110 is closed. Those skilled in the art will appreciate that the switch handle 112 may be used for any type of switch. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the hazardous location enclosure 100. For example, the switch handle 112 may point to "OFF" on the switch position indicator 114 when a disconnect switch located inside the hazardous location enclosure 100 is disengaged. In such a case, all equipment located inside the hazardous location enclosure 100, as well as the equipment (e.g., a motor) controlled by the equipment located inside the hazardous location enclosure 100, may be without power.

Referring now to FIG. 2, an example of a hazardous location enclosure 100 in an open position In accordance with one or more example embodiments is shown. The hazardous location enclosure 100 is in the open position because the enclosure cover (not shown) is not secured to the enclosure body 124. The hinges 116 attached to the left side of the enclosure body 124 are also attached to the left side of the enclosure cover, which is swung outward from the enclosure body 124. Because the hazardous location enclosure 100 is in the open position, the components of the hazardous location enclosure 100 are accessible to a user.

As described above with respect to FIG. 1, the enclosure body 124 includes two or more mounting brackets 120. In addition, in one or more example embodiments, the enclosure body 124 includes an enclosure engagement surface 210, against which the enclosure cover 102 meets when the hazardous location enclosure 100 is in the closed position. A number of fastening device apertures 220 are shown around the enclosure engagement surface 210, where each of the fastening device apertures 220 are configured to receive a fastening device 118 that traverses through the enclosure cover 102, as described above with respect to FIG. 1. The number of fastening device apertures 220 may vary, depending on one or more of a number of factors, including but not limited to the size of the fastening device apertures 220, a standard that the hazardous location enclosure 100 meets, and the type of fastening device 118 used. The number of fastening device apertures 220 may be zero.

In one or more example embodiments, the hazardous location enclosure 100 of FIG. 2 includes a mounting plate 282 that is affixed to the back of the cavity 202 (also called the interior) of the hazardous location enclosure 100. The mounting plate 282 may be configured to receive one or more components such that the one or more components are affixed to the mounting plate 282. The mounting plate 282 may include one or more apertures configured to receive securing devices that may be used to affix a component to the mounting plate 282. The mounting plate 282 may be made of any suitable material, including but not limited to the material of the enclosure body 124. In one or more example embodiments, some or all of the one or more components may be mounted directly to an inside wall of the hazardous location enclosure 100 rather than to the mounting plate 282.

In one or more example embodiments, a VFD 206 is affixed to the mounting plate 282 in the cavity 202 of the hazardous location enclosure 100. The VFD 206 may include any components used to drive a motor and/or other device using variable control signals for controlled starts, stops, and/or operations of the motor and/or other devices. Examples of components of a VFD include, but are not limited to, discrete relays, a programmable logic controller (PLC), a programmable logic relay (PLR), an uninterruptible power supply (UPS), and a distributed control system (DCS). In one or more example embodiments, one or more components of the VFD may replace the VFD. For example, the VFD may be substituted by one or more PLCs, one or more PLRs, one or more UPSs, one or more DCSs, and/or other heat-generating components.

In one or more example embodiments, a switch 208 is affixed to the mounting plate 282 in the cavity 202 of the hazardous location enclosure 100. The switch 208 may be configured to electrically and/or mechanically isolate, and/or change the mode of operation of, one or more components located inside the hazardous location enclosure 100 and/or one or more components located outside the hazardous location enclosure 100. The switch 208 may be any type of switch, including but not limited to a disconnect switch, a test switch, a reset switch, an indicator switch, and a relay switch. For example, the switch 208 may be a disconnect switch that is used to cut off power to all components in the hazardous location enclosure 100 and all devices located outside the explosion-proof enclosure 100 that are eon trolled by the components inside the hazardous location enclosure 100. As another example, the switch 208 may be a bypass switch that is used to deactivate a protection scheme (e.g., a relay) or some other particular component or group of components located inside the hazardous location enclosure 100.

The switch 208 may further be configured to receive, through mechanical and/or electrical means, a directive to change states (e.g., open, closed, hold) from a component located on the enclosure cover. For example, if the enclosure cover 102 includes a switch handle (as described above with respect to FIG. 1), then a switch handle shaft 232 may extend from the switch handle through the enclosure cover 102 to a switch coupling 230 of the switch 208. When the hazardous location enclosure 100 is in the closed position, the switch handle shaft 232 couples with the switch coupling 230, and switch 208 may be operated by operating the switch handle located outside the hazardous location enclosure, as described above with respect to FIG. 1.

In one or more example embodiments, one or more relays (e.g., relay 212) are affixed to the mounting plate 282 in the cavity 202 of the hazardous location enclosure 100. A relay 212 may control one or more operations of one or more components located in, or associated with, the hazardous location enclosure 100. Specifically, a relay 212 may, through one or more relay contacts, allow electrical current to flow and/or stop electrical current from flowing to one or more components in the hazardous location enclosure 100 based on whether a coil of the relay 212 is energized or not. For example, if the coil of the relay 212 is energized, then a contact on the relay may be closed to allow current to flow to energize a motor. The relay 212 may be activated based, on a timer, a current, a voltage, some other suitable activation method, or any combination thereof. The relay 212 may also be configured to emit a signal when a condition has occurred. For example, the relay 212 may Hash a red light to indicate that the VFD 206 is in an alarm state.

In one or more example embodiments, wiring terminals 214 are affixed to the mounting plate 282 in the cavity 202 of the hazardous location enclosure 100. Wiring terminals 214 are a series of terminals where one terminal is electrically connected to at least one other terminal in the series of terminals while remaining electrically isolated from the remaining terminals in the series of terminals. In other words, two or more terminals among the series of terminals act as a junction point where multiple wires may be electrically connected through the joined terminals.

In one or more example embodiments, one or more entry holes 216 may extend through one or more sides (e.g., bottom) of the enclosure body 124. Each entry hole 216 may be configured to allow cables and/or wiring for power, control, and/or communications to pass through from outside the hazardous location enclosure 100 to one or more components inside the hazardous location enclosure 100. An entry hole 216 may be joined with a conduit and coupling from outside the hazardous location enclosure 100 to protect the cables and/or wiring received by the entry hole 216 and to help maintain the integrity of the hazardous location enclosure 100 through the entry hole 216.

Figure 3:
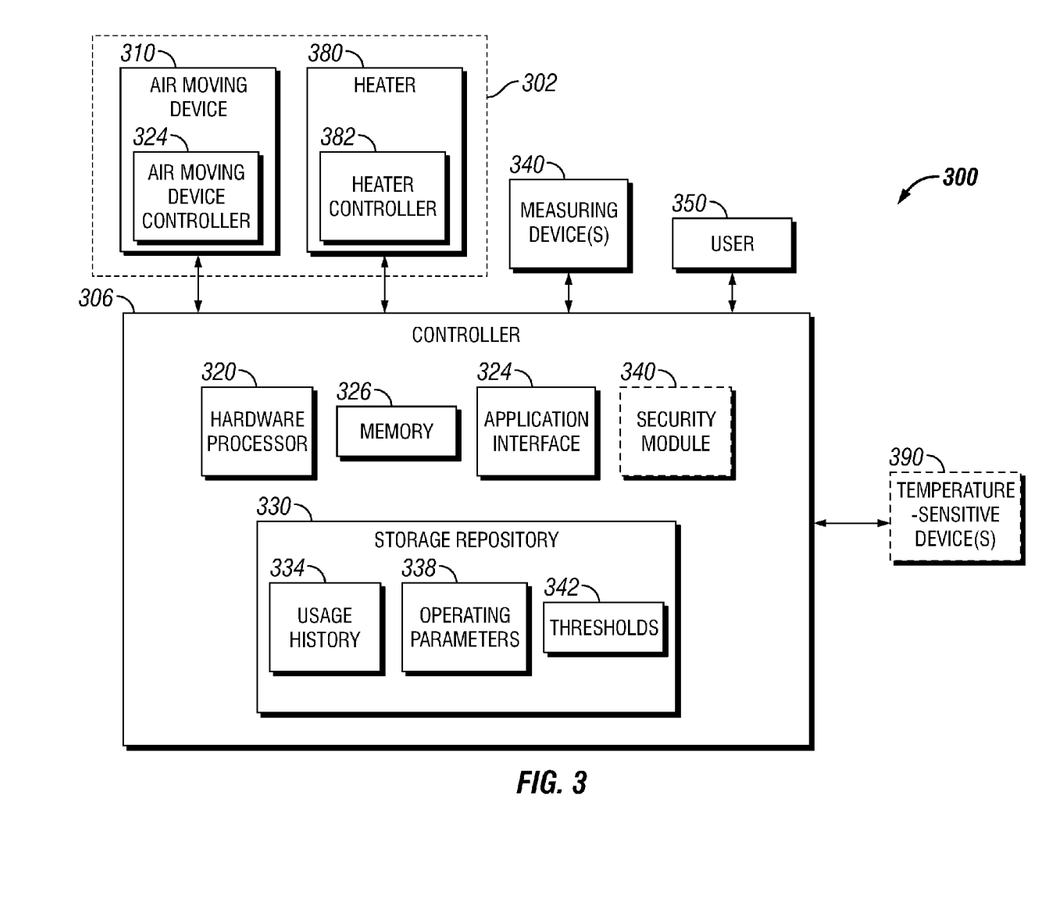
FIG. 3 shows a system for controlling temperature that includes a controller in accordance with one or more example embodiments.

FIG. 3 shows a block diagram of a system 300 that includes a controller 306 in accordance with certain example embodiments. The controller 306 of FIG. 3 includes a hardware processor 320, memory 326, an application interface 324, a storage repository 330, and an optional security module 340. In one or more example embodiments, one or more of the components shown in FIG. 3 may be omitted, repeated, and/or substituted. Accordingly, example embodiments of a system having a controller should not be considered limited to the specific arrangements of components shown in FIG. 3.

Referring to FIGS. 1-3, the controller 306 is operably and communicably coupled to one or more climate control devices 302. A climate control device 302 is any device that can change the temperature (heating, cooling) in the cavity 202 of the enclosure 100. A climate control device 302 can include, but is not limited to, the air moving device 310 (which can include the air moving device controller 324, if applicable), the heater 380 (which can include the heater controller 382, if applicable), a heat exchanger, a thermo-electric generator, and a thermoelectric cooler. In certain example embodiments, a climate control device 302, such as a thermoelectric cooler, can both heat and cool the cavity 202 of the enclosure 100.

The controller 306 may also communicate with other components (e.g., a measuring device 340, the switch 408, equipment to adjust the baffle 426 (described below with respect to FIG. 4)) and/or a user 350. Communication with the user 350 may be conveyed directly (e.g., an indicating light or display screen mounted on the exterior of the door of the hazardous location enclosure 402) and/or indirectly (e.g., sending a signal to a control room where the communication is conveyed).

In certain example embodiments, the controller 306 determines when a temperature (as received from a measuring device 340) within the cavity 202 of the enclosure 402 (described below with respect to FIG. 4) is too high (exceeds a temperature threshold 342) or too low (falls below a temperature threshold 342). Based on such determination, the controller 306 can operate and/or control a climate control device 302 (e.g., the air moving device 310 and/or the heater 380) to bring the temperature of the cavity 202 of the enclosure 402 within a temperature range that does not exceed or fail below a temperature threshold 342. The temperature thresholds 342 can bound a range of temperatures that can be referred to as an operating range of temperatures. A temperature threshold 342 is a value that can have one or more of a number of forms, including but not limited to a number, a percentage, an increment, and a change.

For each component (e.g., air moving device 310, heater 380) operably and communicably coupled to the controller 306, the controller 306 and such components communicate using commands (signals). Specifically, the controller 306 can send signals to, and/or receive signals from, each component. The signals sent between the controller 306 and a component can include, but are not limited to, commands, information, requests, instructions, status, and data. The controller 306 can communicate with each component through hard-wires and/or a wireless interface.

A signal generated by the controller 306 for a component can be based on a signal received from the same and/or a different component. For example, the controller 306 can receive a signal from a measuring device 340 to communicate that the temperature in the cavity 202 of the enclosure 402 is outside the operating range of temperatures. In such a case, the controller 306 can generate and send a signal to the heater 380 and/or the air moving device 310 to operate so that the temperature of the cavity 202 of the enclosure 402 falls back within the operating range of temperatures. As another example, the controller 306 can control the operation of a baffle within the enclosure 402 to adjust the temperature within the enclosure 402. In addition, or in the alternative, a signal generated by the controller 306 for a component can be based on one or more of a number of other factors, including but not limited to a lapse of time, adjustment of a switch, and loss of power.

In certain example embodiments, one or more signals generated and sent by the controller 306 to a component can be based on determining whether one or more temperature thresholds 342 has been surpassed. A temperature threshold 342 can be a high temperature or a low temperature. There can be multiple temperature thresholds 342, for a high temperature and/or a low temperature. Such temperature thresholds 342 can be stored in the storage repository 330 (described below).

Optionally, in certain example embodiments, the controller 306 is also operably and communicably coupled to one or more temperature-sensitive devices 390. In such a case, the controller 306 can send one or more signals to a temperature-sensitive device 390 to alter the operation of the temperature-sensitive device 390. For example, if the temperature-sensitive device 390 is a VFD that is operating within the cavity 202 of the enclosure 402, and if a signal received from a measuring device 340 indicates that the temperature within the cavity 202 of the enclosure 402 exceeds a maximum temperature threshold 342, the controller 306 can send a signal to the VFD to reduce power or turn off so that the VFD does not generate as much heat. At the same time, or at a different time (previously or subsequently), the controller 306 may send a different signal to one or more climate control devices (e.g., the air moving device 310) as a different way to lower the temperature within the cavity 202 of the enclosure 402.

In certain example embodiments, the controller 306 sets and/or adjusts one or more thresholds 342. In such a case, the controller 306 can set and/or adjust a threshold 342 based on the occurrence of certain events (e.g., number of times a threshold 342 is exceeded in a period of time), based on an algorithm embedded in the software stored in memory 326, and/or based on some other factor. The controller 306 can use hysteresis (learn based on historical data) to set and/or adjust a temperature threshold 342, as well as adjust operating times and levels of a climate control device 302. Alternatively, or in addition, a temperature threshold 342 can be set and/or adjusted by a user 350.

As used herein, a threshold 342 (sometimes called a temperature threshold 342) can be any limit that triggers an event by the controller 306. For example, a threshold 342 can cause the controller 306 to control a climate control device 302, while a different threshold 342 can cause the controller 306 to stop controlling a climate control device 302. A threshold 342 can be associated with a temperature, an amount of time, and/or any other suitable measurable factor.

The controller 306 can operate the climate control devices 302 so that such climate control devices 302 do not "flicker" on and off when the temperature of the cavity 202 of the enclosure 402 is at or near a temperature threshold 342. For example, the controller 306 can operate an air moving device 310 when the temperature of the cavity 202 is measured by a measuring device 340 to be 70° C., which equals a temperature threshold 342. In such a case, the controller 306 can continue to operate the air moving device 310 until the temperature of the cavity 202 is measured by a measuring device 340 to be 60° C., which equals another temperature threshold 342. The controller 306 would be inactive with respect to operating the air moving device 310 until the temperature of the cavity 202 is again measured by a measuring device 340 to be 70° C.

The example controller 306 can operate one or more climate control devices 302 using duty cycling. In other words, the controller 306 can turn on and off a climate control device 302 in such a way as to balance between reducing and/or stopping operations of the climate control device 302 to extend the operating life of the climate control device 302 and maintaining a safe operating temperature for the temperature-sensitive devices 390 within the cavity 202 of the enclosure 402. Using duty cycling can also improve data monitoring and acquisition, as well as help with determining preventive maintenance needs. In certain example embodiments, the controller 306 can also, or in the alternative, operate one or more temperature-sensitive devices 390 using duty cycling. The duty cycling used by the controller 306 to operate a climate control device 302 and/or a temperature-sensitive device 390 can be driven by hysteresis.

The controller 306 can also track the usage history 334 of a component, tracks and updates the operating parameters 338 of a component, communicates the usage history 344 and/or operating parameters 338 of a component (as to a user 350), determines when maintenance of a component is needed based on the usage history 334 and operating parameters 338 of the component, and/or performs any other suitable function with respect to a component based on the usage history 334 and/or operating parameters 338 of the component.

The signals sent by the controller 306 to a component can be for power and/or control. In certain example embodiments, each signal sent by the controller 306 to a component is of the appropriate level, frequency, language, and protocol to be received and understood by such component. The controller 306 can operate continuously or periodically using external power and/or a battery (not shown) electrically coupled to the controller 306.

In certain example embodiments, the controller 306 operates over a broad range of temperatures within the cavity 202 of the enclosure 402. For example, the controller 306 can operate when the temperature within the cavity 202 of the enclosure 402 is between −20° C. and −40° C. As another example, the controller 306 can operate when the temperature within the cavity 202 of the enclosure 402 is up to 70° C.

Optionally, the example controller 306 can include a solid state relay (not shown) that can directly control (in lieu of a local controller, such as the heater controller 382) one or more components that operate at one or more of a number of voltages (e.g., 480 V alternating current (AC), 600 VAC, 230 VAC, 380 VAC) and/or currents. In other words, the relay can receive and deliver an operating line voltage and/or current directly to the component, rather than using direct current or an AC control voltage (e.g., 120 VAC, 24 VAC). For example, if the heater 380 operates on 480 VAC, the controller 306 can use the solid state relay to turn the heater 380 on and off and/or to control the heat output of the heater 380. In such a case, the heater controller 382 can be omitted from the heater 380.

In one or more example embodiments, the controller 306 is implemented according to a client-server topology. The controller 306 can correspond to enterprise software running on one or more servers, and in some embodiments may be implemented as a peer-to-peer system, or resident upon a single computing system. In addition, the controller 306 may be accessible from other machines using one or more application programming interfaces and/or user interfaces (not shown). In one or more example embodiments, the controller 306 may be accessible over a network connection (not shown), such as the Internet, by one or more users 350. Further, information and/or services provided by the controller 306 may also be stored and accessed over the network connection.

Alternatively or additionally, in one or more example embodiments, the controller 306 is a local computer system of the user 350. In such embodiments, the controller 306 is, optionally, not implemented using a client-server topology. For example, the controller 306 corresponds to a laptop computer, desktop computer, mobile device, another type of computing device, or a combination of multiple computing devices. Additionally or alternatively, the controller 306 is a distributed computer system and/or a multi-processor computer system in which the computer system includes multiple distinct computing devices.

The example storage repository 330 is a persistent storage device (or set of devices) that stores software and data used to assist the controller in selecting a bit for a field operation. In one or more example embodiments, the storage repository 330 stores usage history 334 of a component (including the air moving device 310 and the heater 380), operating parameters 338 of a component, and thresholds 342. Examples of a storage repository 330 include, but are not limited to, a database (or a number of databases), a file system, a hard drive, some other form of data storage, or any suitable combination thereof. The storage repository 330 is located on multiple physical machines, each storing all or a portion of the usage history 334, operating parameters 338, and thresholds 342 according to some example embodiments. Each storage unit or device can be physically located in the same or a different geographic location.

Continuing with FIG. 3, the hardware processor 320 of the controller 306 executes software in accordance with one or more embodiments of the invention. Specifically, the hardware processor 320 executes software instructions to operate the controller 306 and/or any of the components (including the air moving device 310 and the heater 380), as well as software used by the user 350. The hardware processor 320 is an integrated circuit, a central processing unit, a multi-core processing chip, a multi-chip module including multiple multi-core processing chips, or other hardware processor 320 in one or more example embodiments. The hardware processor 320 is known by other names, including but not limited to a computer processor, a microprocessor, a microcontroller, and a multi-core processor.

In one or more embodiments of the invention, the hardware processor 320 executes software instructions stored in memory 326. The memory 326 includes one or more cache memories, main memory, and/or any other suitable type of memory. The memory 326 is discretely located within the controller 306 relative to the hardware processor 320 according to some example embodiments. In certain configurations, the memory 326 can be integrated with the hardware processor 320.

Optionally, in one or more example embodiments, the security module 340 secures interactions between the controller 306 and the user 350. More specifically, the security module 340 authenticates communication from software based on security keys verifying the identity of the source of the communication. For example, user software may be associated with a security key enabling the user software to interact with the controller 306. Further, the security module 340 restricts receipt of information, requests for information, and/or access to information in some example embodiments.

The user software interacts with the controller 306 using a user interface. In this case, the user interface maintains an active session with the controller 306 after the security module 340 has authenticated the user software. For example, the user interface continues to interact with the controller 306 as the user 350 views various content in the user software. In this example, the user interface receives notifications from the controller 306 for presenting to the user 350.

Figure 4:
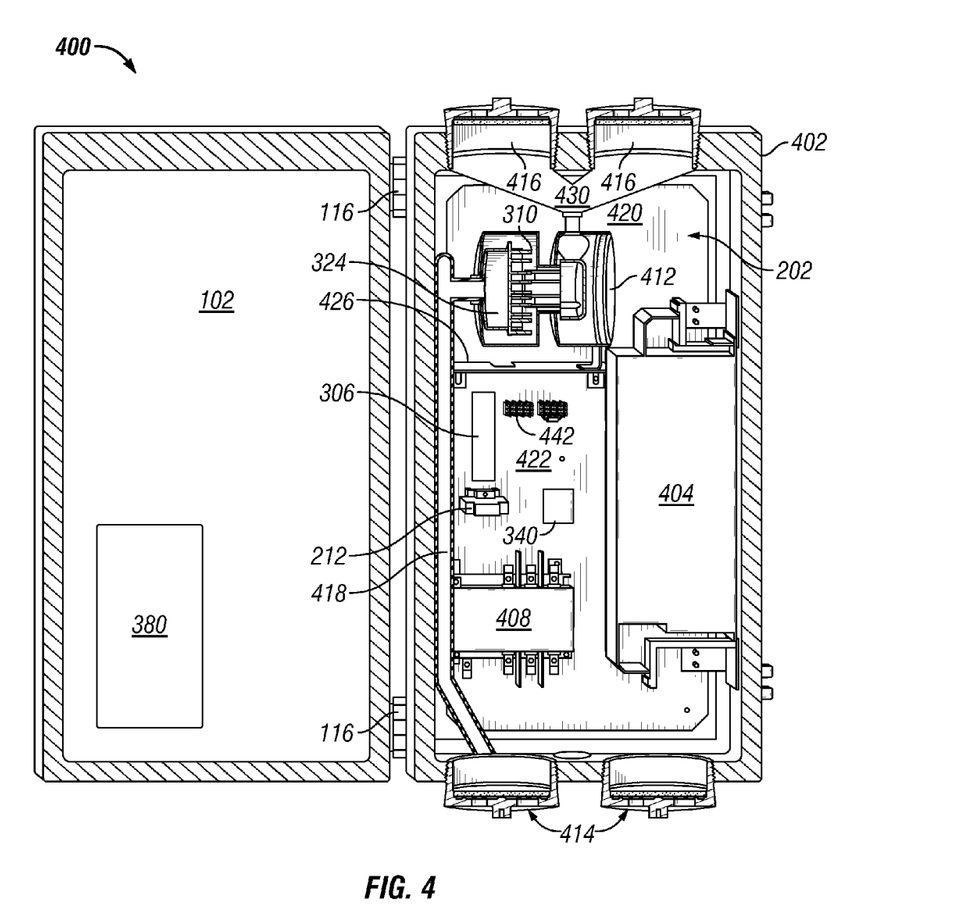
FIG. 4 shows a system for controlling temperature within a hazardous location enclosure in accordance with one or more example embodiments.

FIG. 4 shows an example system 400 of a hazardous location enclosure 402 in which temperature is controlled in accordance with one or more example embodiments. In one or more example embodiments, one or more of the components shown in FIG. 4 may be omitted, repeated, and/or substituted. Accordingly, example embodiments of a system using a controller should not be considered limited to the specific arrangements of components shown in FIG. 4. Features shown but not described and/or labeled in FIG. 4 are described and/or labeled above with respect to FIGS. 1-3.

Referring to FIGS. 1-4, the enclosure 402 includes an example controller 306 located within the cavity 202 (also called a cavity), where the cavity 202 is defined by the walls of the enclosure 402. In one or more example embodiments, the cavity 202 of the hazardous location enclosure 402 is a single region. Alternatively, the cavity 202 of the hazardous location enclosure 402 may be divided into two or more regions. Such divisions of the cavity 202 can be installed in conjunction with an air moving device 310 and/or heater 380 to better control the temperature inside the cavity 202. In such a case, a baffle 426 can be used to divide the cavity 202 of the enclosure 402 into multiple regions.

In one or more example embodiments, a baffle 426 is inserted within the cavity 202 of the explosion-proof enclosure 402. The baffle 426 may be configured to separate the first region 420 (i.e., the high temperature portion of the cavity 202 of the hazardous location enclosure 402) from the second region 422 (i.e., the low temperature portion of the cavity 202 of the hazardous location enclosure 402). For example, as shown in FIG. 4, the cavity 202 of the hazardous location enclosure 402 is divided into a first region 420 and a second region 422. The baffle 426 may be made of any material (e.g., metal, plastic) and in any dimensions (e.g., length, width, thickness, shape) suitable to provide a physical barrier between the first region 420 and the second region 422 within the cavity 202 of the hazardous location enclosure 402.

The baffle 426 may be positioned within the cavity 202 of the hazardous location enclosure 402 on a side of the air moving device 310 proximate to the second region 422. In this example, the baffle 426 is positioned just below the air moving device 310 and the air moving device controller 324 to separate the first region 420 from the second region 422. The baffle 426 can be adjustable and/or retractable (e.g., rotating louvers) so that there is only a single region rather than two or more separate regions within the hazardous location enclosure 402. In such a case, the baffle 426 can be adjusted and/or retracted by the controller 306.

Generally, the air moving device 310 is used to lower the temperature inside the cavity 202 and the heater 380 is used to increase the temperature inside the cavity 202. The first region 420 may have an equal or higher temperature than the second region 422 while one or more components within the cavity 202 of the hazardous location enclosure 402 are operating. The air moving device 310 and the air moving device controller 324 shown in FIG. 4 are located in the first region 420. Further, the VFD 404 shown in FIG. 4 is located in the second region 422.

In one or more example embodiments, an air moving device 310 is positioned within the interior of the hazardous location enclosure 402. The air moving device 310 may be a blower, a fan, or some similar device that is configured to move air. By moving air within the hazardous location enclosure 402, the temperature within the hazardous location enclosure 402 can be changed. The air moving device 310 may include a motor that is used to control the flow of air (e.g., exhaust, air) within the hazardous location enclosure 402.

The air moving device 310 may move air inside the hazardous location enclosure 402. Specifically, the air moving device 310 may draw intake air from outside the hazardous location enclosure 402, move intake air and/or exhaust air within the hazardous location enclosure 402, and/or remove exhaust air from the interior of the hazardous location enclosure 402. The air moving device 310 may drive a differential pressure within the interior of the hazardous location enclosure 402 to create the air flow.

The air moving device 310 may draw intake air from outside the hazardous location enclosure 402 through one or more intake apertures in the hazardous location enclosure 402. In one or more example embodiments, an air intake filter assembly 414 is incorporated into the one or more intake apertures in the hazardous location enclosure 402. Specifically, the air intake filter assembly 414 may be coupled to an intake aperture in a wall of the hazardous location enclosure 402. In one or more example embodiments, the intake aperture in the wall of the hazardous location enclosure 402 is located in, or adjacent to, the second region 422 of the interior of the hazardous location enclosure 402.

In one or more example embodiments, the air intake filter assembly 414 is configured to remove contaminants from the intake air as the intake air passes from outside the hazardous location enclosure 402 to the cavity 202 of the hazardous location enclosure 402. The air intake filter assembly 414 may also be configured to cool the intake air as the intake air passes from outside the hazardous location enclosure 402 to the interior of the hazardous location enclosure 402. The air intake filter assembly 414 (and its components) may be coupled to the hazardous location enclosure 402 in such a way, and assembled in such a way, as to meet the standards required for an hazardous location enclosure. The air intake filter assembly 414 may include a sintered filter.

In one or more example embodiments, the air intake filter assembly 414 includes one or more other components (e.g., a heat exchanger, copper mesh) that are coupled to the air intake filter assembly 414 to help cool the intake air. For example, the air intake filter assembly 414 may include a heat exchanger for cooling the intake air before the intake air is brought into the cavity 202 of the hazardous location enclosure 402. As another example, the air intake filter assembly 414 may include a thermoelectric cooler for cooling the intake air.

Each air intake filter assembly 414 may be configured in one of a number of different ways. In one or more example embodiments, the air intake filter assembly 414 is configured to include at least one cavity, where a filter (e.g., sintered material) couples to each cavity. In example embodiments where an air intake filter assembly 414 includes multiple cavities, more air flow (i.e., a higher rate of air flowing per unit time) may be possible compared to an air intake filter assembly 414 with only a single cavity. Each filter of the air intake filter assembly 414 may be configured to remove contaminants from the intake air as the intake air passes through the filter to the interior of the hazardous location enclosure 402. Each filter of the air intake filter assembly 414 may also be configured to cool the intake air as the intake air passes through the filter to the interior of the hazardous location enclosure 402. Each cavity may be one of a number of shapes, including but not limited to an ellipse, a rectangle, an octagon, a triangle, and a circle.

Once the intake air is within the cavity 202 of the hazardous location enclosure 402, the air moving device 310 can pass the intake air over one or more temperature-sensitive devices 390. In one or more example embodiments, one or more of the temperature-sensitive devices 390 are located in the second region 422. For example, the air moving device 310 may pass the intake air over the VFD 404 in the second region 422 of the cavity 202 of the hazardous location enclosure 402. The air moving device 310 may pass the intake air over the temperature-sensitive devices 390 using a channel or intake (not shown), separate from the air moving device intake 418. In such a case, the channel may be positioned in the second region 422 of the cavity 202 of the hazardous location enclosure and configured to direct the intake air toward the temperature-sensitive devices 390.

As the air moving device 310 passes the intake air over the one or more temperature-sensitive devices 390, the intake air cools the temperature-sensitive devices 390. As the temperature-sensitive devices 390 are cooled, the temperature of the intake air increases to generate exhaust air. In other words, the temperature of the exhaust air is greater than the temperature of the intake air. In one or more example embodiments, the air moving device 310 is further configured to remove the exhaust air from the cavity 202 of the hazardous location enclosure 402.

In one or more example embodiments, the air moving device 310 is controlled by the controller 306. The air moving device 310 (with or without the air moving device controller 324, described below) can be a heat-generating component and/or a temperature-sensitive device 390. In such a case, intake air (or a portion thereof) may be directed to and passed over the air moving device 310 and/or any other temperature-sensitive device 390 to cool the air moving device 310 and/or any other temperature-sensitive device 390. The intake air may be directed to and passed over the air moving device 310 and/or any other temperature-sensitive device 390 using an airflow within the hazardous location enclosure 402 created by the air moving device 310. Alternatively, or in addition, the intake air may be directed to and passed over the air moving device 310 and/or any other temperature-sensitive device 390 using some other means, including but not limited to a pressure differential and another air moving device.

An air moving device intake 418 may be used to direct intake air toward the air moving device 310 (which may include the air moving device controller 324) and/or any other temperature-sensitive device 390 within the cavity 202 of the hazardous location enclosure 402. The air moving device intake 418 may take the intake air from any point within or outside the hazardous location enclosure 402, including but not limited to an aperture in the hazardous location enclosure 402 and an intake air filter assembly 414 coupled to an aperture in the hazardous location enclosure 402. The air moving device Intake 418 may be made of any material (e.g., plastic, aluminum, ethylene propylene diene monomer (EPDM) rubber), have any configuration, and/or be of any size suitable for directing a portion of the intake air toward the air moving device 310 and/or any other temperature-sensitive device 390.

As the intake air passes over a temperature-sensitive device 390 (including the air moving device 310 and/or the air moving device controller 324), the intake air cools the temperature-sensitive device 390. As the temperature-sensitive device 390 is cooled, the temperature of the intake air increases to generate additional exhaust air. In other words, the temperature of the additional exhaust air is greater than the temperature of the intake air. In one or more example embodiments, the air moving device 310 is further configured to remove the additional exhaust air from the cavity 202 of the hazardous location enclosure 402.

In one or more example embodiments, the air moving device controller 324 is a component located within the cavity 202 of the hazardous location enclosure 402. For example, as shown in FIG. 4, the air moving device controller 324 can be located in the first region 420. The air moving device controller 324 can communicate with the controller 306 and operate the air moving device 310 based on commands (signals) received from the controller 306. Specifically, the controller 306 can send signals to, and/or receive signals from, the air moving device controller 324. The signals sent between the controller 306 and the air moving device controller 324 may include, but are not limited to, commands, information, requests, instructions, status, and data. The controller 306 may communicate with the air moving device controller 324 through hard-wires and/or a wireless interface.

Based on the commands received from the controller 306, the air moving device controller 324 can control the operation of the air moving device 310. For example, the air moving device controller 324 may, based on corresponding commands received from the controller 306, start the air moving device 310, stop the air moving device 310, and increase and/or decrease the speed at which the air moving device 310 operates. In certain example embodiments, the air moving device controller 324 is physically separate from the controller 306 and is located adjacent to the air moving device 310. Alternatively, the air moving device controller 324 is part of the controller 306.

In one or more example embodiments, the controller 306 is also coupled to other components. Such other components may be located within the cavity 202 of the hazardous location enclosure 402 and/or adjacent to the hazardous location enclosure 402. Such other components can provide information related to the temperature of the cavity 202 of the hazardous location enclosure 402, the operation of the heater 380, and/or the operation of the air moving device 310. Examples of such other components may include, but are not limited to, a measuring device 340 (e.g., a temperature sensor, an air flow sensor) and a pushbutton.

For example, the controller 306 may be coupled to a measuring device 340 that measures the temperature (i.e., a temperature sensor) at some point in the cavity 202 of the hazardous location enclosure 402. When the temperature measured by the measuring device 340 exceeds a first threshold temperature value (also called a temperature threshold 342 or simply a threshold 342), the controller 306 may send a command to the air moving device-controller 324 to start the air moving device 310 and regulate the speed of the air moving device 310 until the temperature falls below a second, lower threshold value (also a temperature threshold 342). When, the temperature at the point in the cavity 202 of the hazardous location enclosure 402 measured by the measuring device 340 falls below the second threshold temperature, then the controller 306 can send a different commend to the air moving device controller 324 to stop the air moving device 310.

The controller 306 and/or the air moving device controller 324 can be a temperature sensitive device 390. Other temperature-sensitive devices 390 may include, but are not limited to, a VFD 404, a relay 212, a wiring terminal 442, and a switch 408, all of which are substantially similar to the corresponding components (also called devices) described above with respect to FIG. 2. The controller 306 can interface with the VFD 404. Specifically, the controller 306 can send signals to, and/or receive signals from, the VFD 404. The signals sent between the controller 306 and the VFD 404 may include, but are not limited to, commands, information, requests, instructions, status, and data. The controller 306 may communicate with the VFD 404 through hard-wires and/or a wireless interface.

In one or more example embodiments, the one or more temperature-sensitive devices 390 generates a quantifiable amount of heat energy during operation. For example, a VFD 404 may generate 1200 watts or more of heat energy inside the hazardous location enclosure 402. As another example, the air moving device controller 324 and/or the air moving device 310 may generate 370 watts or more of heat energy inside the hazardous location enclosure 402. As yet another example, the switch 408 may generate 27 watts or more of heat energy inside the hazardous location enclosure 402.

In one or more example embodiments, the air moving device intake 412 is coupled to the air moving device 310. The air moving device intake 412 may be configured to receive the air heated by the temperature-sensitive devices 390 (also called exhaust air). Specifically, the air moving device intake 412 may be configured to draw the exhaust air proximate to the temperature-sensitive devices 390 (e.g., the VFD 404) toward an aperture of the hazardous location enclosure 402. The air moving device intake 412 may include a screen, filter, and/or other similar feature to remove contaminants from the exhaust air and/or to lower the temperature of the exhaust air.

In one or more example embodiments, the manifold 430 is coupled to the air moving device 310 and/or the air moving device intake 412. The manifold 430 may direct some or all of the exhaust air and the additional exhaust air (if any) outside the hazardous location enclosure 402. The manifold 430 may form a seal between the air moving device 310 (and/or the air moving device intake 412) and the exhaust air filter assembly 416, described below. By forming a seal, the manifold 430 may create and/or maintain a differential pressure to create air flow to remove the exhaust air and/or the additional exhaust air from the hazardous location enclosure 402.

The air moving device 310 may remove some or all of the exhaust air and the additional exhaust air from the cavity 202 of the hazardous location enclosure 402 through one or more outlet apertures (different from the intake apertures described above with respect to the intake air) in the hazardous location enclosure 402. In one or more example embodiments, an exhaust air filter assembly 416 is incorporated into the one or more outlet apertures in the hazardous location enclosure 402. Specifically, the exhaust air filter assembly 416 may be coupled to an outlet aperture in a wall of the hazardous location enclosure 402. In one or more example embodiments, the outlet aperture in the wall of the hazardous location enclosure 402 is located in, or adjacent to, the first region 420 of the cavity 202 of the hazardous location enclosure 402. The outlet apertures and intake apertures may be on opposite walls of the hazardous location enclosure 402.

In one or more example embodiments, the exhaust air filter assembly 416 is substantially similar to the air intake filter assembly 414. Thus, the description above with respect to the air intake filter assembly 414 may also apply to the exhaust air filter assembly 416. For example, the exhaust air filter assembly 416 may allow exhaust air to pass from the cavity 202 of the hazardous location enclosure to outside the hazardous location enclosure. The exhaust air may have a higher temperature than the temperature of the intake air. The exhaust air filter assembly 416 may further meet and maintain the standards and requirements for a hazardous location enclosure. For example, the exhaust air filter assembly 416 may include a sintered filter.

The example heater 380 shown in FIG. 3 radiates, when operating, heat on the cavity 202 of the enclosure 402. In certain example embodiments, the heater 380 is positioned at some location in the cavity 202 of the enclosure 402. For example, as shown in FIG. 3, the heater 380 can be mounted on the inner surface of the enclosure cover 102. In the alternative, or additionally, the heater 380 can be mounted at any other location within the cavity 202 of the enclosure 402. The heater 380 can be a single heater or a number of heaters that operate (and are controlled by the controller 306) independently or inter-dependently. In certain example embodiments, the heater 380 is powered and/or controlled by the controller 306.

The heater 380 can generate a fixed or a variable amount of heat when operating. The heat generated and radiated by the heater 380 raises the temperature of the cavity 202 of the enclosure 402. The heater 380 can operate on electricity, gas, and/or any other source of energy. In certain example embodiments, the heater 380 operates in conjunction with the air moving device 310, some other air moving device, a baffle (e.g., baffle 426), ductwork, and/or any other device that can help direct the heat generated by the heater 380 toward a particular component within the cavity 202 of the enclosure 402.

In certain example embodiments, the controller 306 can be bypassed, either manually (e.g., a user 350 changing the state of a switch) or automatically (e.g., in emergency or maintenance conditions). When the controller 306 is bypassed, one or more climate control devices can be operated, or be prevented from operating, for an extended period of time.

Figure 5:
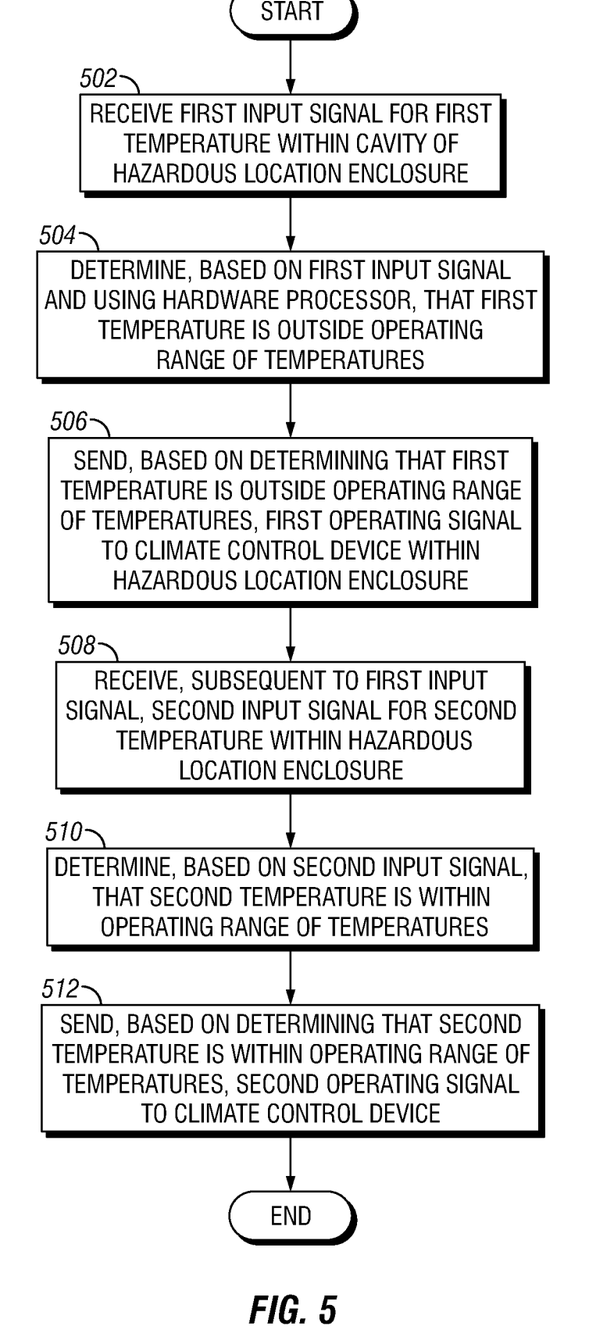
FIG. 5 shows a flowchart of a method for controlling temperature within a hazardous location enclosure in accordance with one or more example embodiments.

FIG. 5 shows a flowchart of a method 500 for controlling temperature inside a hazardous location enclosure in accordance with one or more example embodiments. While the various steps in this flowchart are presented and described sequentially, one of ordinary skill will appreciate that some or all of the steps may be executed in different orders, may be combined or omitted, and some or all of the steps may be executed in parallel. Further, in one or more of the example embodiments of the invention, one or more of the steps described below may be omitted, repeated, and/or performed in a different order. In addition, a person of ordinary skill in the art will appreciate that additional steps, omitted in FIG. 5, may be included in performing this method 500. Accordingly, the specific arrangement of steps shown in FIG. 5 should not be construed as limiting the scope of the invention. Further, a particular computing device, as described, for example, in FIG. 6 below, may be used to perform one or more of the steps for the method 500 described below.

Now referring to FIG. 1-5, the example method 500 begins at the START step and proceeds to step 502. In step 502, first input signal is received for a first temperature within the cavity 202 of the hazardous location enclosure 402. In certain example embodiments, the first input signal is received by the controller 306 and is sent by a measuring device 340. The first input signal can be one of a number of discrete signals sent by the measuring device 340 to the controller 306. In such a case, the first input signal is sent randomly, on a regular interval, and/or based on the occurrence of some event (e.g., a temperature excursion, the passage of time). Alternatively, the first input signal can be a continuous signal sent by the measuring device 340 to the controller 306.

In step 504, that the first temperature is determined to be outside an operating range of temperatures. In one or more example embodiments, the controller 306 determines that the first temperature is outside the operating range of temperatures. The determination can be based on the first input signal. The controller 306 can determine that the first temperature is outside the operating range of temperatures using a hardware processor 320. The operating range of temperatures can be based on one or more temperature thresholds 342 stored in the storage repository 330 of the controller 306.

In step 506, a first operating signal is sent to a climate control device within the cavity 202 of the hazardous location enclosure 402. In certain example embodiments, the first operating signal is sent by the controller 306. The first operating signal can be sent based on the controller 306 determining that the first temperature is outside the operating range of temperatures (e.g., exceeds a temperature threshold 342). The climate control device can be the air moving device 310 and/or the heater 380.

In step 508, a second input signal for a second temperature is received within the hazardous location enclosure. In certain example embodiments, the controller 306 receives the second input signal, which can be sent by the same or a different measuring device 340 than the measuring device 340 described above with respect to step 502. The second input signal can be sent subsequent to the first input signal.

In step 510, the second temperature is determined to be within the operating range of temperatures. In one or more example embodiments, the controller 306 determines that the second temperature is within the operating range of temperatures. The determination can be based on the second input signal. The controller 306 can determine that the second temperature is within the operating range of temperatures using a hardware processor 320. The operating range of temperatures can be based on one or more temperature thresholds 342 stored in the storage repository 330 of the controller 306, where the temperature thresholds 342 can be the same or different than the temperature thresholds 342 described above with respect to step 504. The operating range of temperatures can be the same or a different range of temperatures described above with respect to step 404.

In step 512, a second operating signal is sent to the climate control device. In certain example embodiments, the second operating signal is sent by the controller 306. The second operating signal can be sent based on the controller 306 determining that the second temperature is within the operating range of temperatures. The climate control device can be the air moving device 310 and/or the heater 380. When step 532 is completed, the process continues to the END step.

Figure 6:
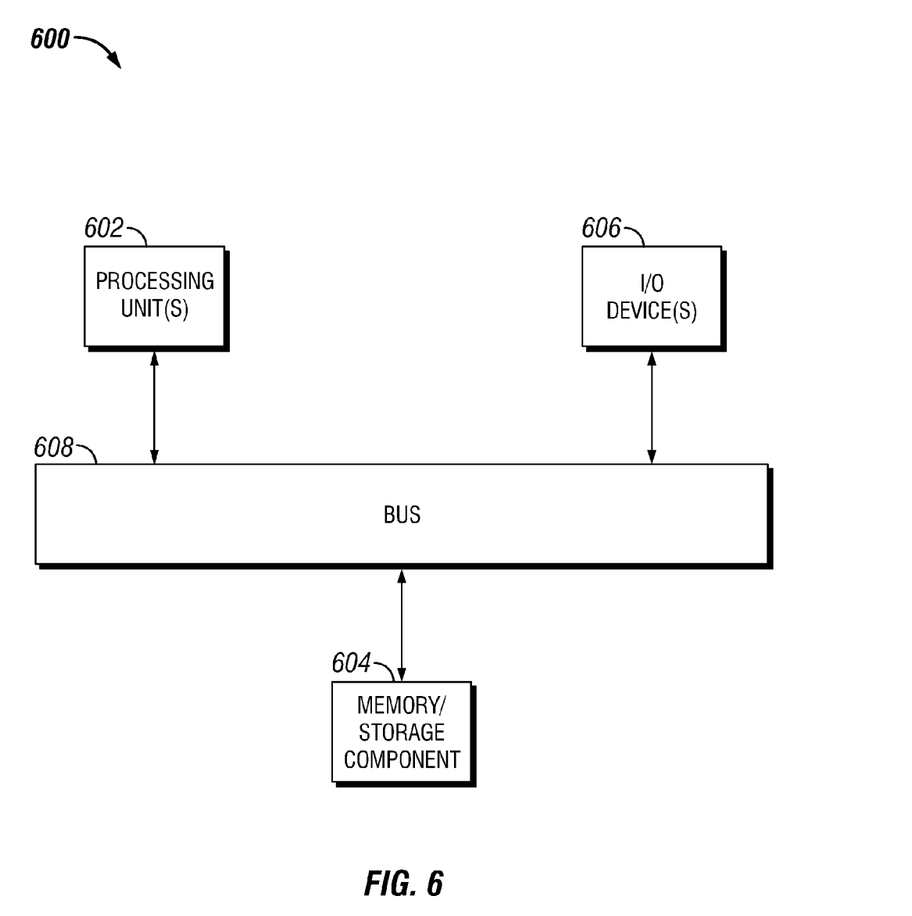
FIG. 6 shows a computing device in accordance with one or more example embodiments.

FIG. 6 illustrates one embodiment of a computing device 600 that can implement one or more of the various techniques described herein, and which may be representative, in whole or in part, of the elements described herein. Computing device 600 is only one example of a computing device and is not intended to suggest any limitation as to scope of use or functionality of the computing device and/or its possible architectures. Neither should computing device 600 be interpreted as having any dependency or requirement relating to any one or combination of components illustrated in the example computing device 600.

Computing device 600 includes one or more processors or processing units 602, one or more memory 326/storage components 604, one or more input/output (I/O) devices 606, and a bus 608 that allows the various components and devices to communicate with one another. Bus 608 represents one or more of any of several types of bus structures, including a memory 326 bus or memory 326 controller, a peripheral bus, an accelerated graphics port, and a processor or local bus using any of a variety of bus architectures. Bus 608 can include wired and/or wireless buses.

Memory/storage component 604 represents one or more computer storage media. Memory/storage component 604 may include volatile media (such as random access memory (RAM)) and/or nonvolatile media (such as read only memory 326 (ROM), flash memory, optical, disks, magnetic disks, and so forth). Memory/storage component 604 can include fixed media (e.g., RAM, ROM, a fixed hard drive, etc.) as well as removable media (e.g., a Flash memory drive, a removable hard drive, an optical disk, and so forth).

One or more I/O devices 606 allow a customer, utility, or other user 350 to enter commands and information to computing device 600, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 600 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 600 includes at least the minimal processing, input, and/or output means necessary to practice one or more embodiments.

Further, those skilled in the art will appreciate that one or more elements of the aforementioned computer device 600 may be located at a remote location and connected to the other elements over a network. Further, one or more embodiments may be implemented on a distributed system having a plurality of nodes, where each portion of the implementation (e.g., controller 306) may be located on a different node within the distributed system. In one or more embodiments, the node corresponds to a computer system. Alternatively, the node may correspond to a processor with associated physical memory. The node may alternatively correspond to a processor with shared memory and/or resources.

One or more example embodiments provide for controlling temperature inside a hazardous location enclosure. Specifically, in one or more example embodiments, a controller is used to control one or more air .moving devices and or one or more heaters within the interior of the hazardous location enclosure. In such a case, the controller indirectly controls (e.g., raises, lowers) the temperature in the interior of the hazardous location enclosure.

The temperature on the interior of the hazardous location enclosure may increase to levels that may be detrimental to the operation of one or more temperature-sensitive devices, heat-generating components, and/or climate control devices located on the interior of the hazardous location enclosure. The increase in temperature on the interior of the hazardous location enclosure may be caused by one or more heat-generating components and/or a high temperature ambient environment in which the hazardous location enclosure is positioned. Similarly, a low temperature ambient environment in which the hazardous location enclosure is positioned can cause the temperature in the interior of the hazardous location enclosure from getting so low as to inhibit the proper operation of one or more temperature-sensitive devices.

Example embodiments described herein may control the temperature inside the hazardous location enclosure to maintain an acceptable temperature that assures continued operation of the components and/or devices located in the interior an explosion-proof enclosure while also maintaining the standards and/or requirements for an explosion-proof enclosure. As a result, use of example embodiments described herein may allow for the inclusion of one or more heat-generating components within the interior of the explosion-proof enclosure without affecting the operation of the devices and/or components located inside, or associated, with, the explosion-proof enclosure. Consequently, example embodiments described herein may lower equipment and maintenance costs, allow for easier maintenance, and increase reliability.

Although controlling temperature inside a hazardous location enclosure is described with reference to preferred embodiments, it should be appreciated by those skilled in the art that various modifications are well within the scope of controlling temperature inside a hazardous location enclosure. From the foregoing, it will be appreciated that an embodiment of controlling temperature inside a hazardous location enclosure overcomes the limitations of the prior art. Those skilled in the art will appreciate that controlling temperature inside a hazardous location enclosure is not limited to any specifically discussed application and that the example embodiments described herein are illustrative and not restrictive. From the description of the example embodiments, equivalents of the elements shown therein will suggest themselves to those skilled in the art, and ways of constructing other embodiments of controlling temperature inside a hazardous location enclosure will suggest themselves to practitioners of the art. Therefore, the scope of controlling temperature inside a hazardous location enclosure is not limited herein.

What is claimed is:

1. A hazardous location enclosure system comprising:
a hazardous location enclosure comprising at least one wall forming a cavity, wherein the at least one wall is designed to contain an explosion that originates within the cavity, wherein the at least one wall forms at least one joint, wherein the at least one joint comprises at least two surfaces of the at least one wall that meet and provide a path, from the cavity to outside the hazardous location enclosure, wherein the at least one joint allows gases from within the cavity during the explosion to escape across the at least one joint of the enclosure and cool as the gases exit the cavity;
a temperature-sensitive component positioned within the cavity;
a measuring device that measures a temperature within the cavity of the hazardous location enclosure;
a climate control device configured to change the temperature within the cavity; and
a controller operatively coupled to the climate control device, the temperature-sensitive component, and the measuring device, wherein the controller operates the climate control device to change the temperature within the cavity of the hazardous location enclosure when the temperature, as measured by the measuring device, falls outside an operating range of temperatures,
wherein operating the climate control device brings the temperature within the operating range of temperatures and thereby reduces a risk of the explosion originating within the cavity of the hazardous location enclosure,
wherein the controller alters an operation of the temperature-sensitive component when the temperature within the cavity is outside the operating range of temperatures.

2. The enclosure system of claim 1, wherein the controller is positioned within the cavity.

3. The enclosure system of claim 1, wherein the climate control device comprises at least one selected from a group consisting of an air moving device, a heater, and a baffle.

4. The enclosure system of claim 1, wherein the climate control device is positioned within the cavity.

5. The enclosure system of claim 1, wherein the controller controls the climate control device when the temperature within the cavity of the hazardous location enclosure is at least −40° C. and less than 70° C.

6. The enclosure system of claim 1, wherein the controller comprises a relay that provides a line voltage directly to the climate control device.

7. The enclosure system of claim 6, wherein the climate control device is a heater, and wherein the line voltage is approximately 480V alternating current.

8. The enclosure system of claim 1, wherein the controller controls the climate control device based on a usage history and a hysteresis-driven duty cycle of the climate control device and the temperature-sensitive component.

9. The enclosure system of claim 1, wherein the controller is programmable by a user.

10. The enclosure system of claim 1, further comprising:
a bypass switch that, when activated, bypasses the controller to prevent the controller from controlling the climate control device.

11. The enclosure system of claim 1, wherein the controller is also operatively coupled to the temperature-sensitive device.

12. The enclosure system of claim 1, further comprising:
at least one air intake filter assembly disposed in the at least one wall of the hazardous location enclosure, wherein the at least one air intake filter assembly allows ambient air to be drawn into the cavity by the climate control device, wherein the at least one air intake filter assembly forms the at least one joint with the at least one wall.

13. The enclosure system of claim 12, further comprising:
at least one exhaust air filter assembly disposed in the at least one wall of the hazardous location enclosure, wherein the at least one exhaust air filter assembly allows ambient air to be expelled from the cavity by the climate control device, wherein the at least one exhaust air filter assembly forms the at least one joint with the at least one wall.

14. The enclosure system of claim 1, wherein the controller is further coupled to the temperature-sensitive component, wherein the controller controls the temperature-sensitive component when the temperature within the cavity exceeds the temperature threshold value.

15. The enclosure system of claim 1, wherein the measuring device further measures a component temperature of the temperature-sensitive component, wherein the controller alters the operation of the temperature-sensitive component when the temperature-sensitive component exceeds a component temperature threshold value.

16. The enclosure system of claim 15, wherein the temperature-sensitive component is capable of causing the explosion that originates within the cavity when the temperature-sensitive component exceeds the component temperature threshold value.

17. A hazardous location enclosure system comprising:
a hazardous location enclosure comprising at least one wall forming a cavity, wherein the at least one wall is designed to contain an explosion that originates within the cavity, wherein the at least one wall forms at least one joint, wherein the at least one joint comprises at least two surfaces of the at least one wall that meet and provide a path, from the cavity to outside the hazardous location enclosure, wherein the at least one joint allows gases from within the cavity during the explosion to escape across the at least one joint of the enclosure and cool as the gases exit the cavity;
a temperature-sensitive component positioned within the cavity;

a measuring device that measures a temperature within the cavity of the hazardous location enclosure;

a climate control device configured to change the temperature within the cavity; and a controller operatively coupled to the climate control device, the temperature-sensitive component, and the measuring device, wherein the controller operates the climate control device to change the temperature within the cavity of the hazardous location enclosure when the temperature, as measured by the measuring device, falls outside a safe operating range of temperatures for the temperature-sensitive device, wherein operating the climate control device brings the temperature of the temperature-sensitive device within the safe operating range of temperatures.

18. The enclosure system of claim 17, wherein the controller alters an operation of the temperature-sensitive component when the temperature within the cavity is outside the safe operating range of temperatures.

* * * * *